United States Patent
Akimoto et al.

(10) Patent No.: US 7,066,980 B2
(45) Date of Patent: *Jun. 27, 2006

(54) METHOD FOR MANUFACTURING METAL POWDER

(75) Inventors: Yuji Akimoto, Fukuoka (JP); Shinichi Ono, Fukuoka (JP); Kazuro Nagashima, Ohnojo (JP); Masayuki Maekawa, Sasaguri-machi (JP); Hidenori Ieda, Dazaifu (JP)

(73) Assignee: Shoei Chemical, Inc., Tokyo (JP)

( * ) Notice: Subject to any disclaimer, the term of this patent is extended or adjusted under 35 U.S.C. 154(b) by 94 days.

This patent is subject to a terminal disclaimer.

(21) Appl. No.: 10/657,569

(22) Filed: Sep. 8, 2003

(65) Prior Publication Data

US 2004/0055418 A1    Mar. 25, 2004

(30) Foreign Application Priority Data

Sep. 10, 2002    (JP) ............................ 2002-264750

(51) Int. Cl.
*B22F 9/20*    (2006.01)

(52) U.S. Cl. .......................................... 75/351; 75/369
(58) Field of Classification Search .................. 75/351, 75/369, 371
See application file for complete search history.

(56) References Cited

U.S. PATENT DOCUMENTS

| | | | | |
|---|---|---|---|---|
| 4,804,167 A | * | 2/1989 | Kock et al. | 266/186 |
| 5,439,502 A | | 8/1995 | Kodas et al. | |
| 5,508,015 A | * | 4/1996 | Gonzalez et al. | 423/613 |
| 5,852,768 A | | 12/1998 | Jacobsen et al. | |
| 5,928,405 A | | 7/1999 | Ranade et al. | |
| 2002/0000137 A1 | * | 1/2002 | Akimoto et al. | 75/369 |

FOREIGN PATENT DOCUMENTS

| | | |
|---|---|---|
| EP | 1 151 817 | 11/2001 |
| JP | 2002-20809 | 1/2002 |

* cited by examiner

*Primary Examiner*—George Wyszomierski
(74) *Attorney, Agent, or Firm*—Flynn, Thiel, Boutell & Tanis, P.C.

(57) ABSTRACT

A method in which a metal powder is produced by ejecting a thermally decomposable metal compound powder into a reaction vessel through a nozzle together with a carrier gas under the condition V/S>600, where V is the flow rate of the carrier gas per unit time (liter/min), and S is the cross-sectional area of the nozzle opening part ($cm^2$), and heating this metal powder at a temperature which is higher than the decomposition temperature of the metal compound powder and not lower than (Tm−200)° C., where Tm is the melting point of the metal, in a state where the metal compound powder is dispersed in the gas phase at a concentration of 10 g/liter or less. The method provides a fine, spherical, highly-crystallized metal powder which has a high purity, high density, high dispersibility and extremely uniform particle size, at low cost and using a simple process.

8 Claims, No Drawings

METHOD FOR MANUFACTURING METAL POWDER

BACKGROUND OF THE INVENTION

1. Field of the Invention

The present invention relates to a method for manufacturing a metal powder that is suitable for use in electronics, and more particularly relates to a method for manufacturing a metal powder with a fine, uniform particle size and a high degree of crystallinity which is useful as a conductive powder for use in a conductive paste.

2. Description of the Prior Art

In conductive metal powders used in conductive pastes that are used to form electronic circuits, it is desirable that these powders contain few impurities, that the powders be fine powders with a mean particle size ranging from 0.1 µm or less to approximately 10 µm, that the particle size and particle shape be uniform, and that the particles be monodisperse particles with no aggregation. Furthermore, it is also necessary that the dispersibility of the powder in the paste be good, and that the crystallinity be good so that there is no non-uniform sintering. Especially in cases where such powders are used to form internal conductors or external conductors in multilayer ceramic electronic parts such as multilayer capacitors, multilayer inductors and the like, highly-crystallized or single-crystal metal powders with a spherical shape and low activity, in which the particles are finer sub-micron particles with a uniform particle size and shape, and in which expansion and shrinkage caused by oxidation-reduction tend not to occur during sintering, and the sintering initiation temperature is high, are required in order to prevent structural defects such as delamination, cracking or the like, and in order to enable a reduction in film thickness of the conductor layers.

Specifically, multilayer ceramic electronic parts are generally manufactured by alternately laminating a plurality of unfired ceramic green sheets of dielectric materials, magnetic materials or the like, and internal conductive paste layers whose conductive components are powders of noble metals such as palladium, silver-palladium or the like or base metals such as nickel, copper or the like, and co-firing the thus laminated body at a high temperature. However, in cases where easily oxidizable base metals are used in the internal conductors, various problems arise. For example, in cases where a nickel powder is used as the conductive component of the internal conductive paste, the laminated body is heated in an oxidizing atmosphere up to the point of a binder removal process that is ordinarily performed at a temperature of approximately 300 to 600° C., so that the organic vehicle in the paste and ceramic green sheet is completely removed by combustion. In this case, the nickel powder is slightly oxidized. Afterward, firing is performed in an inert atmosphere or a reducing atmosphere, and a reduction treatment is performed if necessary. However, it is difficult to achieve complete reduction of the nickel powder oxidized in the binder removal process, and this leads to a deterioration in electrical characteristics such as a rise in resistance and the like. Furthermore, expansion and shrinking of the volume of the electrodes occur along with this oxidation-reduction, and since such changes in volume do not coincide with the sintering shrinkage behavior of the ceramic layers, structural defects such as delamination, cracking and the like tend to occur. Furthermore, in a non-oxidizing atmosphere, a nickel powder shows rapid sintering, so that the internal conductors become discontinuous films as a result of over-sintering, leading to the problems of a rise in resistance, disruption of circuits and an increase in the thickness of the conductors, which is contrary to the need for a reduction in film thickness of internal conductor layers made along with an increase in the number of laminated layers in recent years. Such oxidation and over-sintering also present similar problems in the case where external conductors are formed by co-firing using a nickel paste. Accordingly, there is a demand for a highly-crystallized nickel powder which is at least resistant to oxidation at the time of binder removal, and which has a high sintering initiation temperature.

Meanwhile, palladium, which is a noble metal, has the property of undergoing oxidation at relatively low temperatures during firing, and being reduced when heated to even higher temperatures. As a result, structural defects caused by the mismatching of sintering shrinkage behavior between electrode layers and ceramic layers tend to occur. Accordingly, in the case of palladium and palladium alloys as well, resistance to oxidation is desirable and, in terms of resistance to oxidation, highly-crystallized powders with a spherical shape, and especially single-crystal powders, are extremely superior.

Conventionally, a spray pyrolysis method and a vapor phase method have been known as methods for manufacturing such metal powders with a high degree of crystallinity.

The spray pyrolysis method is a method in which a solution or suspension containing one or more compounds is formed into fine liquid droplets, and these liquid droplets are heated preferably at a high temperature near or not lower than the melting point of the metals, so that the metal compounds are pyrolyzed to form a metal or alloy powder. Using this method, a highly-crystallized or single-crystal metal or alloy powder which has a high purity, a high density and a high dispersibility can easily be obtained. In this method, however, large amounts of water or organic solvents such as an alcohol, acetone, ether or the like are used as solvents or dispersing media, so that the energy loss during pyrolysis is large, and the cost is increased. Specifically, in this process, pyrolysis of the metal compound is performed simultaneously with the evaporation of the solvent by heating, or pyrolysis of the metal compound is performed following evaporation of the solvent. In either case, however, a large amount of energy is required in order to evaporate the solvent. Furthermore, since the particle size distribution of the powder becomes broad due to the aggregation and splitting of liquid droplets, it is difficult to set the reaction conditions such as the atomizing velocity, concentration of liquid droplets in the carrier gas, retention time in the reaction vessel and the like, and the productivity is poor. Furthermore, in the case of base metal powders such as nickel, iron, cobalt, copper and the like, if water is used as the solvent, oxidation tends to occur at high temperatures as a result of oxidizing gases generated by the decomposition of the water, so that a powder with a good crystallinity cannot be obtained.

On the other hand, in the case of the vapor phase method, in which a vapor of a metal compound is reduced by a reducing gas at a high temperature, the fine metal powder that is produced tends to aggregate, and control of the particle size is difficult. Furthermore, alloys of metals with different vapor pressures cannot be manufactured with an accurately controlled composition.

Furthermore, there is also a method invented by the present inventors, in which a metal powder with a high crystallinity is manufactured using a solid powder as a raw material by pyrolyzing this raw material at a high temperature in a state in which the raw material is dispersed in a gas phase (see Japanese Patent Publication No. 2002-20809). Specifically, a thermally decomposable metal compound powder is supplied to a reaction vessel using a carrier gas, and a highly-crystallized metal powder is obtained by heating this metal compound powder at a temperature that is higher than the decomposition temperature and not lower than (Tm−200)° C. where Tm (° C.) is the melting point of the metal, in a state in which the metal compound powder is dispersed in the gas phase as a concentration of 10 g/liter or less.

In this case, since the starting raw material is a solid metal compound powder, there is no energy loss caused by solvent evaporation, unlike cases where liquid droplets are used. Furthermore, aggregation and splitting tend not to occur, so that the powder can be dispersed in the gas phase at a relatively high concentration. Accordingly, a spherical monodisperse metal powder which has a high crystallinity and a superior resistance to oxidation can be manufactured at a high efficiency. Furthermore, since there is no generation of oxidizing gases from a solvent, this method is also suitable for the manufacture of easily oxidizable base metal powders which must be synthesized at a low oxygen partial pressure. Furthermore, metal powders with an arbitrary mean particle size and a uniform particle size can be obtained by controlling the particle size and conditions of dispersion of the raw material powder. Moreover, since there is no need to form the raw material into a solution or suspension, the starting raw materials can be selected from various materials, so that numerous types of metal powders can be manufactured. In addition, this method is advantageous in that alloy powders with arbitrary compositions can easily be manufactured by mixing or compositing compounds of two or more types of metals.

On the basis of the method described in the above-mentioned Japanese Patent Publication No. 2002-20809, the present inventors conducted further research in order to find conditions that allow the manufacture of fine, highly-crystallized metal powders with a uniform particle size in a more stable manner and with good reproducibility. This research led to the perfection of the present invention.

SUMMARY OF THE INVENTION

It is an object of the present invention to provide a method for obtaining a highly-crystallized monodisperse metal powder with an extremely narrow particle size distribution. It is another object of the present invention to manufacture, at a low cost and by means of a simple process, a fine, spherical, highly-crystallized metal powder which has a high purity, high density, high dispersibility and extremely uniform particle size, and which is especially suitable for use in conductive pastes that are used to manufacture, for example multilayer ceramic electronic parts.

The gist of the present invention is a method for manufacturing a highly-crystallized metal powder, comprising:
ejecting a raw material powder comprising one or more kinds of thermally decomposable metal compounds into a reaction vessel through a nozzle together with a carrier gas under the condition V/S>600, where V is the flow rate of the carrier gas per unit time (liter/min) and S is the cross-sectional area of the nozzle opening part (cm$^2$); and
producing the metal powder by heating the raw material powder at a temperature which is higher than the decomposition temperature of the raw material powder and not lower than (Tm−200)° C. where Tm (° C.) is the melting point of the metal, in a state where the raw material powder is dispersed in the gas phase at a concentration of 10 g/liter or less.

According to one embodiment of the above-mentioned method of the present invention, the raw material powder is mixed and dispersed in the carrier gas using a dispersing apparatus prior to being ejected into the reaction vessel through the nozzle. In a further embodiment of the above-mentioned method of the present invention, the particle size of the raw material powder has been adjusted beforehand, and/or the raw material powders is a composite powder of metal compounds containing two or more metal elements, and the metal powder is an alloy powder.

Furthermore, the gist of the present invention is a method for manufacturing a highly-crystallized metal powder comprising:
preparing a raw material powder containing two or more metal elements, which are constituents of an alloy powder to be produced, at a substantially constant compositional ratio in individual particles of the raw material powder;
collecting the raw material powder;
dispersing the collected raw material powder in a carrier gas;
ejecting the carrier gas having the raw material powder dispersed therein into a reaction vessel through a nozzle under the condition V/S>600, where V is the flow rate of the carrier gas per unit time (liter/min) and S is the cross-sectional area of the nozzle opening part (cm$^2$); and
producing the metal powder in the form of the alloy powder by heating the raw material powder at a temperature which is higher than the decomposition temperature of the raw material powder and not lower than (Tm−200)° C. where Tm (° C.) is the melting point of the alloy to be produced, in a state where the raw material powder is dispersed in the gas phase in the reaction vessel at a concentration of 10 g/liter or less.

Furthermore, the present invention is directed to a highly-crystallized metal powder manufactured by any of the above-mentioned methods, a conductive paste which contains the above-mentioned highly-crystallized metal powder, and a multilayer ceramic electronic part wherein conductor layers are formed using the above-mentioned conductive paste.

DETAILED DESCRIPTION OF THE PREFERRED EMBODIMENTS

There are no restrictions on the metal powders manufactured by the present method. However, the present method is especially suitable for the manufacture of, for example, base metal powders such as copper, nickel, cobalt, iron and the like, and noble metal powders such as silver, palladium, gold, platinum and the like. Mixed powders and alloy powders of a plurality of metals can be manufactured by using combinations of raw material metal compound powders. The "metal powders" of the present invention include such mixed powders and alloy powders.

One or more inorganic compounds such as hydroxides, nitrates, sulfates, carbonates, oxynitrates, oxysulfates, halides, oxides, ammonium complexes or the like, or organic compounds such as carboxylates, resinates, sulfonates, acetylacetonates, monovalent or polyvalent alcoholates of metal, amide compounds, imide compounds, urea compounds or the like, can be used as the thermally decomposable metal compounds employed as the raw materials of the metal powder. In particular, hydroxides, carbonates, oxides, carboxylates, resinates, acetylacetonates, alcoholates and the like are especially desirable, since such compounds do not produce harmful by-products following pyrolysis.

In cases where alloy powders or mixed powders are manufactured, raw material powders containing two or more metal components are used. In such cases, compound powders of the respective metal components may be uniformly mixed and supplied at a specified composition ratio. However, in order to obtain a powder comprising alloy particles in which the individual particles are uniform in terms of composition, it is desirable to use a composite powder which is composited beforehand so that a plurality of metal components to be alloyed are contained at a substantially constant compositional ratio in each particle of the raw material powder. Universally known methods such as a solid phase reaction method in which the metal compound powders used as the raw material are mixed beforehand, heat-treated until the composition is uniform, and then pulverized, as well as a sol-gel method, a co-precipitation method, a homogeneous precipitation method, a complex polymerization method and the like, can be used to obtain a composite powder. In addition, double salt powders, complex salt powders, polynuclear complex powders, complex alkoxide powders, metal double oxide powders and the like may also be used. The raw material powders prepared by the above-mentioned methods are mixed with a carrier gas after being collected.

In the case of noble metals, there are no particular restrictions on the carrier gas and oxidizing gases such as air, oxygen, water vapor and the like, inert gases such as nitrogen, argon and the like, and mixed gases consisting of these gases, may be used. In the case of easily oxidizable base metals such as nickel, copper and the like, an inert gas is used. However, reducing gases such as hydrogen, carbon monoxide, methane, ammonia gas and the like, or organic compounds which decompose to form a reducing atmosphere when heated, such as alcohols, carboxylates and the like, may be mixed with this inert gas in order to heighten the anti-oxidation effect by making the atmosphere during pyrolysis a weakly reducing atmosphere. Furthermore, if metal compounds that can produce a reducing atmosphere by producing carbon monoxide, methane or the like during pyrolysis are used as raw materials, a reducing atmosphere can be created without supplying a reducing gas to the reaction system from the outside, so that there is no need for precise adjustment of the atmosphere at the time of heating.

In the method of the present invention, it is important that the solid raw material powder be ejected into the reaction vessel through the nozzle together with the carrier gas at a specified linear velocity, and that the powder be subjected to a heat treatment at a low concentration and in a highly dispersed state in the gas phase, so that the raw material particles and product particles do not collide with each other.

In order to achieve a high degree of dispersion in the gas phase, the raw material powder is ejected into the reaction vessel at a high speed through the nozzle under such conditions that V/S>600, where V is the flow rate of the carrier gas per unit time (liter/min), and S is the cross-sectional area of the nozzle opening part ($cm^2$). Under such conditions, the raw material powder can be dispersed extremely well in the gas phase without any re-aggregation of the raw material powder, as a result of the rapid expansion of the gas inside the reaction vessel. Accordingly, it is considered that a fine metal powder with an extremely narrow particle size distribution can be produced. Furthermore, there are no particular restrictions on the nozzle. Nozzles of any shape, e.g., nozzles with a round, polygonal or slit-like cross section, nozzles with a tip end of reduced cross section, nozzles with a reduced cross section at an intermediate point and a spreading opening part and the like may be used. Furthermore, the concentration of the raw material powder in the gas phase must be 10 g/liter or less. If the concentration is higher than this, a metal powder with a uniform particle size cannot be obtained because of collisions between particles and sintering. There are no particular restrictions on the dispersion concentration as long as this concentration is 10 g/liter or less and the concentration may be appropriately selected in accordance with the dispersion apparatus and heating apparatus used. However, if the concentration is too low, the production efficiency is poor. Accordingly, the concentration is preferably set at 0.01 g/liter or greater.

In order to supply the individual raw material powder particles to the reaction vessel in an even more securely dispersed state, it is desirable that the raw material powder be mixed and dispersed in the carrier gas using a dispersing device prior to ejecting the raw material powder into the reaction vessel through the nozzle. Universally known gas flow-type dispersing devices, such as an ejector-type device, a venturi-type device, an orifice-type device or the like or a known jet-mill can be used as the dispersing device.

In the present method, since heating is performed in a highly dispersed state of the raw material powder particles in the gas phase, it is conceivable that one metal particle or alloy particle is produced from each particle of the raw material powder. Accordingly, the particle size of the metal powder that is produced varies depending on the kind of the raw material used, but is more or less proportional to the particle size of the raw material powder. Accordingly, a raw material powder with a uniform particle size is used in order to obtain a metal powder with a more uniform particle size. In cases where the particle size distribution of the raw material powder is broad, it is desirable that a particle size adjustment be performed beforehand by performing pulverization, crushing or classification using a pulverizer or classifier. Pulverizers such as a jet-mill, a wet-type pulverizer, a dry-type pulverizer or the like can be used as the pulverizer. Adjustment of the particle size may be performed prior to the dispersion of the raw material powder in the carrier gas, however, this adjustment may also be performed following dispersion in the carrier gas by using a jet-mill or the like.

For example, in order to perform a heat treatment while maintaining a dispersion state with a low concentration, a tubular reaction vessel which is heated from the outside is used, the raw material powder is caused to jet into the reaction vessel at a constant flow velocity together with the carrier gas through a nozzle from one opening part of the reaction vessel, and is caused to pass through the reaction vessel, and the metal powder produced by pyrolysis is collected from the other opening part. The passage time of the mixture of the powder and carrier gas in the reaction vessel is set in accordance with the apparatus used so that the powder is thoroughly heated to a specified temperature. Ordinarily, however, this time is approximately 0.3 to 30 seconds. Besides heating from the outside of the reaction vessel by means of an electric furnace, gas furnace or the like, heating may be accomplished by supplying a fuel gas to the reaction vessel, and using the combustion flame.

In the present invention, since the raw material powder is heated at a low concentration in the gas phase, and in a highly dispersed state as a result of a high-velocity gas flow from the nozzle, the dispersion state can be maintained without any aggregation of the particles due to fusion or sintering even at a high temperature, and it is inferred that a solid phase reaction occurs inside each particle simultaneously with the pyrolysis. Since this is a solid phase reaction within a limited region, it is considered that crystal growth is promoted in a short time, so that a highly dispersible metal powder which has a high crystallinity and few internal defects, and which comprises aggregation-free primary particles, is obtained.

Furthermore, in conventional spray pyrolysis methods, the amount of solvent in the liquid droplets of the raw material is large, and evaporation of the solvent occurs from the surfaces of the liquid droplets. As a result, if the heating temperature is low, hollowing and splitting of the resultant particles tend to occur. Accordingly, in such methods, it is necessary to heat the powder to a temperature higher than the melting point, and to temporarily melt the particles, in order to obtain a spherical, dense powder with a high crystallinity in a short time. In such a case, however, strain of the crystals tends to remain when the particles are cooled from a molten state. In contrast, the reaction of the present invention proceeds entirely in a solid state as was described above, so that a dense, solid metal powder is readily formed even at temperatures lower than the melting point. Accordingly, a metal powder that is free of strain and that has a higher crystallinity can be obtained at temperatures at which the metal does not melt.

If the heating temperature is lower than (Tm−200)° C., where Tm is the melting point of the target metal or alloy, a spherical metal powder with a high crystallinity cannot be obtained. In particular, in order to obtain a true-spherical single-crystal metal powder with smooth surfaces, it is desirable that the heat treatment be performed at a high temperature near or not lower than the melting point of the target metal or alloy.

Furthermore, in cases where the metal involved produces oxides, nitrides, carbides or the like during or after pyrolysis, it is necessary to perform the heat treatment under conditions that cause the decomposition of these compounds.

The metal powders produced by the method of the present invention comprise aggregation-free fine spherical primary particles that have a uniform particle size. Furthermore, these metal powders show a good crystallinity and few defects inside the particles, and contain almost no grain boundaries. Accordingly, the powders show a low activity in spite of the fact that these powders are fine powders. In particular, even in the case of base metals such as nickel, iron, cobalt, copper and the like, and other easily oxidizable metals such as palladium and the like, these powders are resistant to oxidation, and can be maintained in a stable state in air. Furthermore, this oxidation resistance is maintained at high temperatures. Accordingly, in cases where these powders are used in conductive pastes that are used to form the internal conductors or external conductors of multilayer ceramic electronic parts such as multilayer capacitors or the like, parts with superior characteristics in which there is no rise in the resistance due to oxidation of the conductive metal, and no generation of structural defects such as delamination or cracking, etc., caused by oxidation-reduction during firing, can be manufactured.

Next, the present invention will be specifically described in terms of examples and comparative examples.

EXAMPLE 1

A raw material powder having a mean particle size of approximately 1 μm and a maximum particle size of approximately 3 μm was prepared by pulverizing nickel acetate tetrahydrate powder by a jet-mill. This powder was ejected into a reaction tube heated at 1550° C. by an electric furnace through a nozzle with a cross-sectional opening part area of 0.13 cm² at a supply rate of 5 kg/hr together with nitrogen gas supplied as a carrier gas at a flow rate of 200 liter/min, and was heated while being caused to pass through the reaction tube with this dispersion concentration maintained. The concentration of the raw material powder dispersed in the gas phase inside the reaction tube was 0.4 g/liter, and V/S was 1500. The powder thus produced was collected by means of a bag filter.

When the powder thus obtained was analyzed using an X-ray diffractometer (XRD), transmission electron microscope (TEM), scanning electron microscope (SEM) and the like, it was confirmed that this powder was substantially a single-crystal powder of metallic nickel. Observation by means of an SEM showed that the shape of the particles had a true-spherical shape with a size of approximately 0.3 μm, and no aggregation of particles was seen. The particle size distribution measurement based on the weight by a laser diffraction particle size analyzer showed that the 50% average particle diameter (D50) was 0.51 μm. The 99.9% diameter (D99.9) was 1.1 μm which means that 99.9% of particles constituting the powder had a particle size of no more than 1.1 μm. Accordingly, the ratio of D99.9/D50 was 2.2. The characteristics of the powder obtained are shown in Table 1.

EXAMPLES 2 THROUGH 7

Nickel powders were manufactured in the same manner as in Example 1, except that the supply rate of the raw material powder was varied, and the concentration of the raw material powder dispersed in the gas phase, the cross-sectional area of the opening part of the nozzle and the temperature of the electric furnace were set as shown in Table 1. The characteristics of the powders that were obtained are shown in Table 1. In all cases, the ratio of D99.9/D50 was 2.2 to 2.4, so that the particle size distribution was extremely narrow.

EXAMPLE 8

The same raw material powder as that used in Example 1 was dispersed in nitrogen gas using an ejector type dispersing device. The solid-gas mixture that was obtained was ejected into a reaction tube heated at 1550° C. by an electric furnace at a flow rate of 200 liter/min through a nozzle with a cross-sectional opening part area of 0.13 cm², and this mixture was heated while being passed through the reaction tube. The supply rate of the powder and the concentration of the raw material powder dispersed in the gas phase inside the reaction tube were the same as in Example 1. The characteristics of the powder thus obtained are shown in Table 1. As a result of the use of the dispersing device, the powder could be obtained with a more finely uniform particle size than the powder obtained in Example 1.

COMPARATIVE EXAMPLE 1

A nickel powder was manufactured in the same manner as in Example 1, except that the cross-sectional area of the opening part of the nozzle was set at 0.50 cm². V/S was set at 400. The characteristics of the powder thus obtained are shown in Table 1. The powder that was obtained comprised substantially single-crystal true-spherical particles, but the size according to SEM observation was approximately 0.5 μm. The particle size distribution measurement result showed that D50 was 0.74 μm, and the ratio of D99.9/D50 was 5.3. Accordingly, the powder was coarser and had a broader particle size distribution than in Examples of the present invention.

COMPARATIVE EXAMPLE 2

A reaction was performed in the same manner as in Example 1, except that the supply rate of the raw material powder was set at 150 kg/hr. The powder concentration in the gas phase inside the reaction tube was 12.0 g/liter. According to SEM observation of the powder thus obtained, the powder had a broad particle size distribution including amorphous particles with a size of approximately 10 to 20 μm. The particle size distribution measurement result showed that D50 was 2.1 μm, and the ratio of D99.9/D50 was 6.2. The characteristics of the powder are shown in Table 1.

that the temperature of the electric furnace was set at 1500° C. When the powder thus obtained was analyzed by XRD, TEM, SEM and the like, it was confirmed that the powder was substantially a single-crystal, true-spherical nickel-copper alloy powder. The characteristics of the powder thus obtained are shown in Table 1.

EXAMPLE 10

A mixed aqueous solution of silver nitrate and palladium nitrate, which was mixed so that the weight ratio of the metal components was Ag:Pd=8:2, was added dropwise to an aqueous solution of sodium hydrogencarbonate, thus producing a carbonate powder in which silver and palladium were composited. This composite carbonate powder was filtered out, thoroughly washed with water and dried, and the powder was then crushed with a jet-mill to produce a raw

TABLE 1

| | Raw material powder* | Concentration of raw material powder in vapor phase (g/liter) | Cross sectional area S of nozzle opening part (cm²) | V/S | Heating temperature (° C.) | Characteristics of product powder | | | | | |
|---|---|---|---|---|---|---|---|---|---|---|---|
| | | | | | | Composition | Crystallinity | Shape | D50 (μm) | D99.9 (μm) | D99.9/D50 |
| Example 1 | A | 0.4 | 0.13 | 1500 | 1550 | Ni | Single crystal | True spherical | 0.51 | 1.1 | 2.2 |
| Example 2 | A | 0.4 | 0.30 | 670 | 1550 | Ni | Single crystal | True spherical | 0.57 | 1.3 | 2.3 |
| Example 3 | A | 0.4 | 0.03 | 6700 | 1550 | Ni | Single crystal | True spherical | 0.46 | 1.0 | 2.2 |
| Example 4 | A | 0.1 | 0.03 | 6700 | 1550 | Ni | Single crystal | True spherical | 0.43 | 1.0 | 2.3 |
| Example 5 | A | 5.0 | 0.13 | 1500 | 1550 | Ni | Single crystal | True spherical | 0.67 | 1.6 | 2.4 |
| Example 6 | A | 0.4 | 0.13 | 1500 | 1400 | Ni | High crystallinity | Spherical | 0.54 | 1.3 | 2.4 |
| Example 7 | A | 0.4 | 0.13 | 1500 | 1650 | Ni | Single crystal | True spherical | 0.50 | 1.1 | 2.2 |
| Example 8 | A | 0.4 | 0.13 | 1500 | 1550 | Ni | Single crystal | True spherical | 0.46 | 0.95 | 2.1 |
| Comp. Example 1 | A | 0.4 | 0.50 | 400 | 1550 | Ni | Single crysal | True spherical | 0.74 | 3.9 | 5.3 |
| Comp. Example 2 | A | 12.0 | 0.13 | 1500 | 1550 | Ni | Micro-crystalline | ** | 2.1 | 13.0 | 6.2 |
| Example 9 | B | 0.4 | 0.13 | 1500 | 1500 | Ni—Cu alloy | Single crystal | True spherical | 0.85 | 2,1 | 2.5 |
| Example 10 | C | 0.4 | 0.13 | 1500 | 1400 | Ag—Pd alloy | Single crystal | True spherical | 0.92 | 2.2 | 2.4 |

Note:
*A: Nickel acetate tetrahydrate powder, B: Nickel oxide-copper hydroxide composite powder C: silver-palladium composite carbonate powder
**True spherical shape + irregular shape

EXAMPLE 9

A nickel oxide powder in which crystalline particles of a sub-micron fineness were aggregated was pulverized by a jet-mill. This powder was dispersed in an aqueous solution of copper nitrate, and an aqueous solution of sodium hydroxide was added dropwise, thus producing a composite powder in which the nickel oxide powder and copper hydroxide were composited. The composition was set at Ni:Cu=7:3. This composite powder was filtered out, thoroughly washed with water, and dried, and powder was then crushed by a jet-mill to produce a raw material powder. The mean particle size of this powder was approximately 1 μm. Using nitrogen gas containing 4% hydrogen as a carrier gas, a powder was manufactured by the same method as in Example 1, except material powder. The mean particle size of the raw material powder was approximately 1 μm. A powder was manufactured by the same method as in Example 1 except that air was used as the carrier gas, and the temperature of the electric furnace was set at 1400° C. When the powder thus obtained was analyzed by XRD, TEM, SEM and the like, it was confirmed that the powder was substantially a single-crystal true-spherical silver-palladium alloy powder. The characteristics are shown in Table 1.

The method of the present invention allows the easy manufacture, at low cost and a high efficiency, of a spherical highly-crystallized metal powder consisting of monodisperse particles and having an extremely narrow particle size distribution, a high dispersibility and a high purity, using a solid metal compound powder as a raw material, by ejecting this raw material powder at a high velocity from a nozzle together with a carrier gas, and performing a heat treatment at a low concentration and in a highly dispersed state. The metal powder thus obtained has a low activity and a high oxidation resistance. Accordingly, in cases where this powder is used in conductive pastes that are used to form electrodes of multilayer ceramic electronic parts, highly reliable parts which have no structural defects such as cracking, etc., can be manufactured.

Furthermore, the particle size of the resultant powder can easily be adjusted by controlling the particle size and dispersion state of the raw material powder, so that metal powders having an arbitrary mean particle size ranging from 0.1 μm or less to approximately 20 μm can be obtained. Moreover, the selection range of starting raw materials is broad and, accordingly, numerous types of metal powders can be manufactured. In addition, a highly-crystallized alloy powder which has a uniform composition can also easily be manufactured by using raw material powders that contain two or more metal elements at a substantially constant compositional ratio in the individual particles of the raw material powders. Accordingly, the method of the present invention is extremely useful for manufacturing various types of metal powders that are suitable for use in thick-film pastes.

What is claimed is:

1. A method for manufacturing a highly-crystallized metal powder, comprising:

ejecting a raw material powder comprising one or more kinds of thermally decomposable metal compounds into a reaction vessel through a nozzle together with a carrier gas under the condition V/S>600 where V is the flow rate of the carrier gas per unit time (liter/min) and S is the cross-sectional area of the nozzle opening part ($cm^2$); and producing the metal powder by heating the raw material powder at a temperature which is higher than the decomposition temperature of the raw material powder and not lower than (Tm−200)° C. where Tm (° C.) is the melting point of the metal, in a state where the raw material powder is dispersed in the gas phase at a concentration of 10 g/liter or less.

2. The method according to claim 1, wherein the raw material powder is mixed and dispersed in the carrier gas using a dispersing apparatus prior to being ejected into the reaction vessel through the nozzle.

3. The method according to claim 1, wherein the particle size of the raw material powder has been adjusted beforehand.

4. The method according to claim 1, wherein the raw material powder is a composite powder of metal compounds containing two or more metal elements, and the metal powder is an alloy powder.

5. The method according to claim 1, wherein the metal powder has a mean particle size of from approximately 0.1 μm to 20 μm.

6. The method according to claim 1, wherein the raw material powder is dispersed in the gas phase at a concentration of at least 0.01 g/liter.

7. The method according to claim 1, wherein the metal is selected from the group consisting of copper, nickel, cobalt, iron, silver, palladium, gold, platinum and alloys thereof.

8. A method for manufacturing a highly-crystallized metal powder comprising:

preparing a raw material powder containing two or more metal elements, which are constituents of an alloy powder to be produced, at a substantially constant compositional ratio in individual particles of the raw material powder;

collecting the raw material powder;

dispersing the collected raw material powder in a carrier gas;

ejecting the carrier gas having the raw material powder dispersed therein into a reaction vessel through a nozzle under the condition V/S>600, where V is the flow rate of the carrier gas per unit time (liter/min) and S is the cross-sectional area of the nozzle opening part ($cm^2$); and producing the metal powder in the form of the alloy powder by heating the raw material powder at a temperature which is higher than the decomposition temperature of the raw material powder and not lower than (Tm−200)° C. where Tm (° C.) is the melting point of the alloy to be produced, in a state where the raw material powder is dispersed in the gas phase in the reaction vessel at a concentration of 10 g/liter or less.

* * * * *